(12) United States Patent
Polzin et al.

(10) Patent No.: US 6,201,985 B1
(45) Date of Patent: Mar. 13, 2001

(54) SEGMENTED K-SPACE METHOD FOR THREE-DIMENSIONAL MR IMAGING

(75) Inventors: Jason Polzin, Lake Mills; Jie F. Shen, New Berlin, both of WI (US)

(73) Assignee: General Electric Company, Milwaukee, WI (US)

( * ) Notice: Subject to any disclaimer, the term of this patent is extended or adjusted under 35 U.S.C. 154(b) by 0 days.

(21) Appl. No.: 09/134,501

(22) Filed: Aug. 14, 1998

(51) Int. Cl.$^7$ ................................................ A61B 5/055
(52) U.S. Cl. ................................. 600/411; 324/309
(58) Field of Search ................................. 600/410, 413, 600/411; 324/306, 307, 309

(56) References Cited

U.S. PATENT DOCUMENTS

| | | | |
|---|---|---|---|
| 4,767,991 | * 8/1988 | Rzedzian | 324/312 |
| 5,122,747 | 6/1992 | Riederer et al. | 324/309 |
| 5,251,628 | * 10/1993 | Foo | 600/410 |
| 5,348,011 | * 9/1994 | NessAiver | 600/410 |
| 5,377,680 | * 1/1995 | Bernstein et al. | 600/419 |
| 5,435,303 | * 7/1995 | Bernstein et al. | 600/419 |
| 5,539,312 | * 7/1996 | Fu et al. | 324/309 |
| 5,897,496 | * 4/1999 | Watanabe | 600/413 |
| 5,997,883 | * 12/1999 | Epstein et al. | 600/413 |

* cited by examiner

Primary Examiner—Brian L. Casler
(74) Attorney, Agent, or Firm—James O. Skarsten; Christian G. Cabou; Phyllis Y. Price

(57) ABSTRACT

A method is provided for 3-D MR imaging of structure such as a cardiac region of a subject, which is disposed to cyclical motion. The method comprises detecting commencement of each of a succession of motion cycles, and acquiring a set of MR views of the region during each motion cycle. Each view is at a known radial distance from the center of a two-dimensional k-space, and each set includes a view of lowest spatial frequency, which is located proximate to the k-space center. The order in which the views of respective sets are acquired is selected so that the lowest frequency views of respective sets are each acquired at the same specified time, following commencement of their respectively corresponding motion cycles. The views of each set collectively define a segment in the k-space, respective segments being placed in an interleaved spiral or elliptical arrangement with respect to one another.

20 Claims, 4 Drawing Sheets

SEGMENTED K-SPACE METHOD FOR THREE-DIMENSIONAL MR IMAGING

BACKGROUND OF THE INVENTION

The invention disclosed and claimed herein generally pertains to a segmented k-space method for three-dimensional (3D) magnetic resonance (MR) imaging. More particularly, the invention pertains to a method of the above type for acquiring MR images of a patient or other subject which is disposed to experience cyclical, or substantially periodic, motion. Even more particularly, the invention pertains to a method of the above type wherein MR data of lower spatial frequencies may be acquired at any specified time during the motion cycle.

As is well known, cyclical or substantially periodic motion in a subject, such as respiratory or cardiac motion, can cause serious artifacts or other distortions in MR images. To reduce such artifacts in acquiring 3D images of the heart, two different techniques for cardiac gated 3D imaging have been developed. In one technique, the phase-encoding direction is played as the outer loop and the slice-encoding direction is played as the inner loop. In each cardiac cycle, all of the slice-encodings of one of the phase-encoding steps are acquired. The entire scan time is then the product of the total number of phase-encoding steps and the cardiac cycle duration. In the second technique, in order to achieve shorter scan times, the phase-encoding is the inner loop and the slice-encoding is the outer loop. During each cardiac cycle, all of the phase-encodings for one of the slice-encodings are acquired. The entire scan time is then the product of the number of slices and the cardiac cycle duration. For this technique, the amount of time to acquire all the phase-encodings for a single slice-encoding must be less than the available imaging time in each cardiac cycle. Thus, it is seen that the above techniques are limited, either by the total number of phase-encodings, or by the total number of slices. It is believed that a more general technique of 3D cardiac imaging is needed, that allows more flexible choice of scan time by allowing any number of phase/slice encodings within the cycle motion.

Segmented k-space is an alternative approach for acquiring MR images of a subject disposed to experience periodic motion. In segmented k-space, the acquisition is divided into multiple segments, each acquired during a different motion cycle. The only restriction on the number of views, or samples, which are acquired per segment is that such number, multiplied by the sequence repetition time, must be no greater than the available imaging time in each cardiac cycle. In conventional two-dimensional (2D) segmented k-space imaging, each segment is assigned a number. Respective views for a given segment are acquired during a number of sequence repetitions, which occur at specified intervals over the motion cycle to which the given segment corresponds. Usefully, a look-up table is provided that maps or orders a particular segment number and repetition thereof to a particular phase-encoding value, associated with a particular view. One example of a phase-encoding order is segmented interleave, wherein respective view numbers in each segment are separated by a number of steps equal to the total number of segments. The view numbers are interleaved from segment to segment. Various segmented k-space techniques are described in the prior art, for example, in an article by Edelman et al, entitled "Segmented TurboFLASH: Method for Breath-Hold MR Imaging of the Liver with Flexible Contrast", Radiology 177:515–521 (1990).

In the construction of an MR image, the views or data samples which are most useful are those acquired close to the center or origin of k-space, that is, which are associated with low spatial frequencies. For example, on the order of 80% of the MR signal contributed to a reconstructed image may be provided by views acquired from the 10% of k-space which is centered at the origin thereof. In segmented k-space techniques of the type described above, MR samples which are of low-order k-space values are acquired only at the beginning of each motion cycle. As a result, such techniques may be seriously limited, if used to acquire cardiac images or the like at other times during the cardiac cycle. As is well known by those of skill in the art, motion of heart structure, such as a coronary artery, has two phases or motion components during a cardiac cycle, i.e., motion during systole (mechanical contraction of the heart) and motion during diastole (mechanical relaxation of dilation of the heart). It may, for example, be desired to acquire an MR image of the heart structure at the approximate mid-point of the systole motion cycle. At such time, the heart tends to be fairly stable. However, if a prior art segmented k-space technique were to be used, it would be necessary to construct such image primarily from higher spatial frequency k-space samples, rather than from the much more useful low frequency samples located close to the k-space center.

SUMMARY OF THE INVENTION

The invention is generally directed to a method for three-dimensional MR imaging of a region of a subject, wherein the region is disposed to experience cyclical or substantially periodic motion, such as cardiac motion. The invention also applies to respiratory motion or the like. The method comprises detecting commencement of each of a succession of motion cycles, and acquiring a set of MR views or samples of the imaged region during each motion cycle. Each of the views is at a known radial distance from the center of a two-dimensional k-space, and each set includes a view of lowest spatial frequency, which is located proximate to the k-space center. The method further comprises selecting the order in which the views of respective sets are acquired, so that the lowest frequency views are each acquired at the same specified time, following commencement of their respectively corresponding motion cycles.

In a preferred embodiment of the invention, the views of a set collectively define a segment in the two-dimensional k-space, wherein each of the segments has a succession of MR sequence repetitions associated therewith, which occur at selected time intervals during a corresponding one of the motion cycles. The views of a given set, which define a given segment, are each acquired in coincident relationship with one of the repetitions of the given segment. The lowest frequency view of the given set is acquired during a specified repetition, which occurs at the specified time following commencement of the corresponding motion cycle. In one embodiment, commencement of each of the motion cycles is detected by means of cardiac gating, wherein an ECG pulse is sensed at the beginning of each cycle. In another embodiment, commencement of motion cycles is detected by means of respiratory gating.

In a useful embodiment, the views of each of the sets are stored in a look-up table, and respective views are sorted in the table from smallest radial k-space distance to largest radial k-space distance. The order selecting step of the method comprises mapping a particular repetition of a particular segment to each stored view. Usefully, the mapping is implemented by applying a specified index to each of the views stored in the look-up table.

An embodiment of the invention provides a method which allows an arbitrary number of views, each corresponding to a single phase/slice encoding pair, to be acquired during each heartbeat or cardiac cycle. Also, views of low spatial frequencies, i.e., which are located close to the center of k-space, are each acquired at the same arbitrarily selected point in time, during each of a succession of respectively corresponding cardiac cycles.

DETAILED DESCRIPTION OF THE PREFERRED EMBODIMENT

Figure 1:
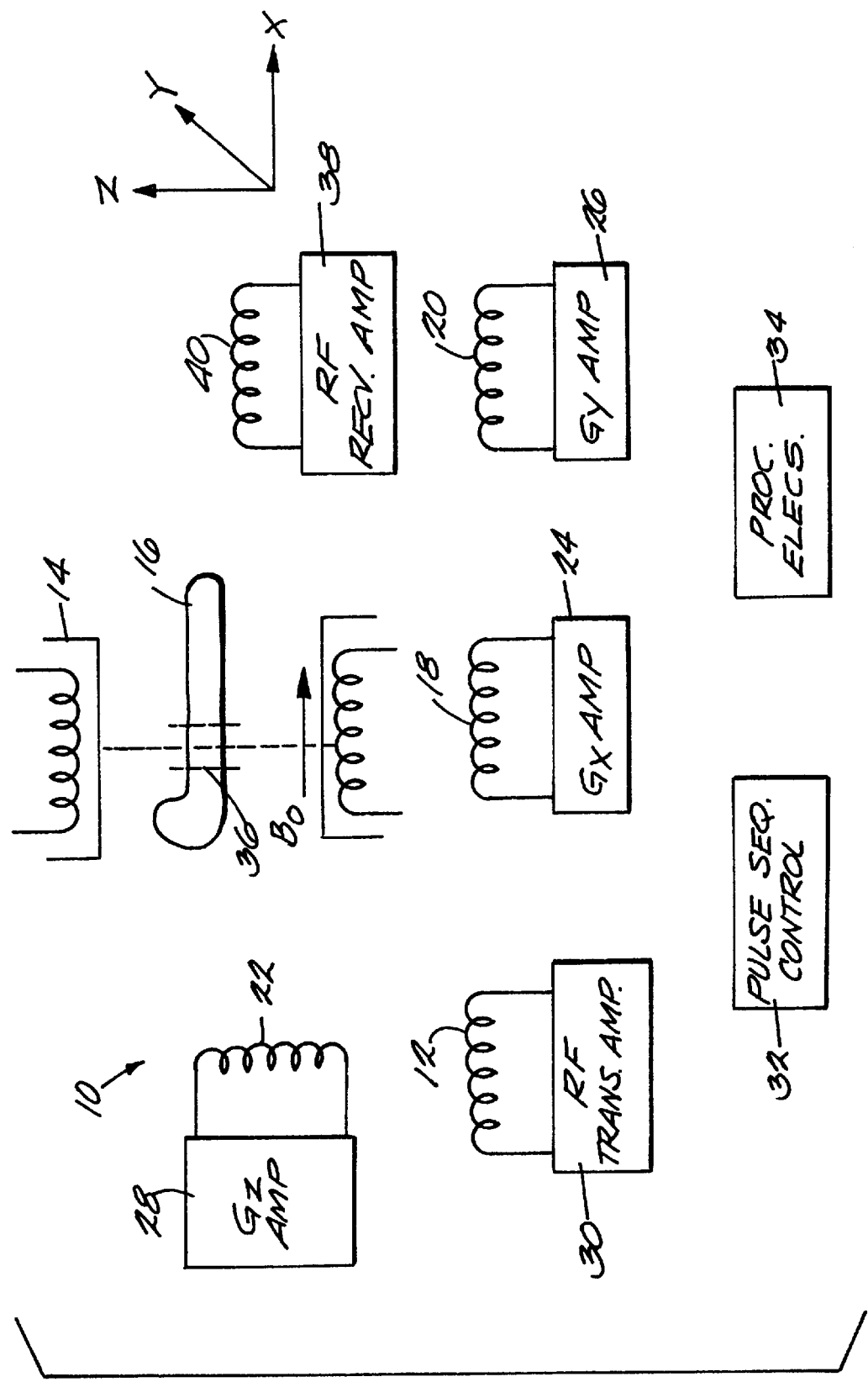
FIG. 1 is a schematic diagram showing basic components of an MR system for use in practicing an embodiment of the invention.

Referring to FIG. 1, there are shown the basic components of an MR system 10 which may be operated to acquire MR data, as described herein. System 10 includes an RF transmit coil 12, as well as a magnet 14 for generating a main or static magnetic field $B_o$ in the bore of a cylindrical magnet. RF coil 12 is operated to transmit RF excitation signals into a 3D region 36 of patient or other imaging subject 16 residing in the magnet bore, in order to produce MR signals. Usefully, region 36 is centered at the magnet isocenter. System 10 further includes gradient coils 18, 20 and 22 for generating $G_x$, $G_y$, and $G_z$ magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30.

Referring further to FIG. 1, there is shown system 10 provided with an RF coil 40, which is operated in association with a receive amplifier 38 to acquire 3D MR signals from the region 36 of patient 16, which may comprise a cardiac region, or section taken through the heart of patient 16. Region 36 is thus subjected to cyclical cardiac motion. System 10 is further provided with a pulse sequence control 32, which is operated to control the RF and gradient amplifiers, and to thereby generate pulse sequences, or periodic sequence repetitions, to produce and acquire sets of MR signals. System 10 also includes computation and processing electronics 34, which selects the order in which data is acquired in accordance with the invention. The construction, functions, and interrelationships of the respective components of MR system 10 are well known and described in the prior art, such as in U.S. Pat. No. 5,672,969, issued Sep. 30, 1997 to Zhou et al.

In an embodiment of the invention, the gradient coils of system 10 are respectively operated to spatially encode data in cardiac region 36, in accordance with any of a number of conventional techniques for 3D MR imaging. These techniques include 3D spin warp and spin echo, though are not necessarily limited thereto. Such techniques are considered to be well known in the art, and therefore are not described herein in detail. In a common arrangement for acquiring MR data from a region 36 or the like, the $G_y$ and $G_z$ gradients provide phase encoding and slice encoding, respectively, and the $G_x$ gradient field serves as the readout gradient. For such convention, a 3D MR signal acquired for specified levels of the $G_y$ and $G_z$ gradients would be uniquely identified, in a two dimensional k-space, by its position along the $k_y$ and $k_z$ axes, respectively. Such signal is referred to herein as a view taken through cardiac region 36, and comprises a value derived from a number of data points taken along the $k_x$ axis, orthogonal to the $k_y$ and $k_z$ axes.

Figure 2:
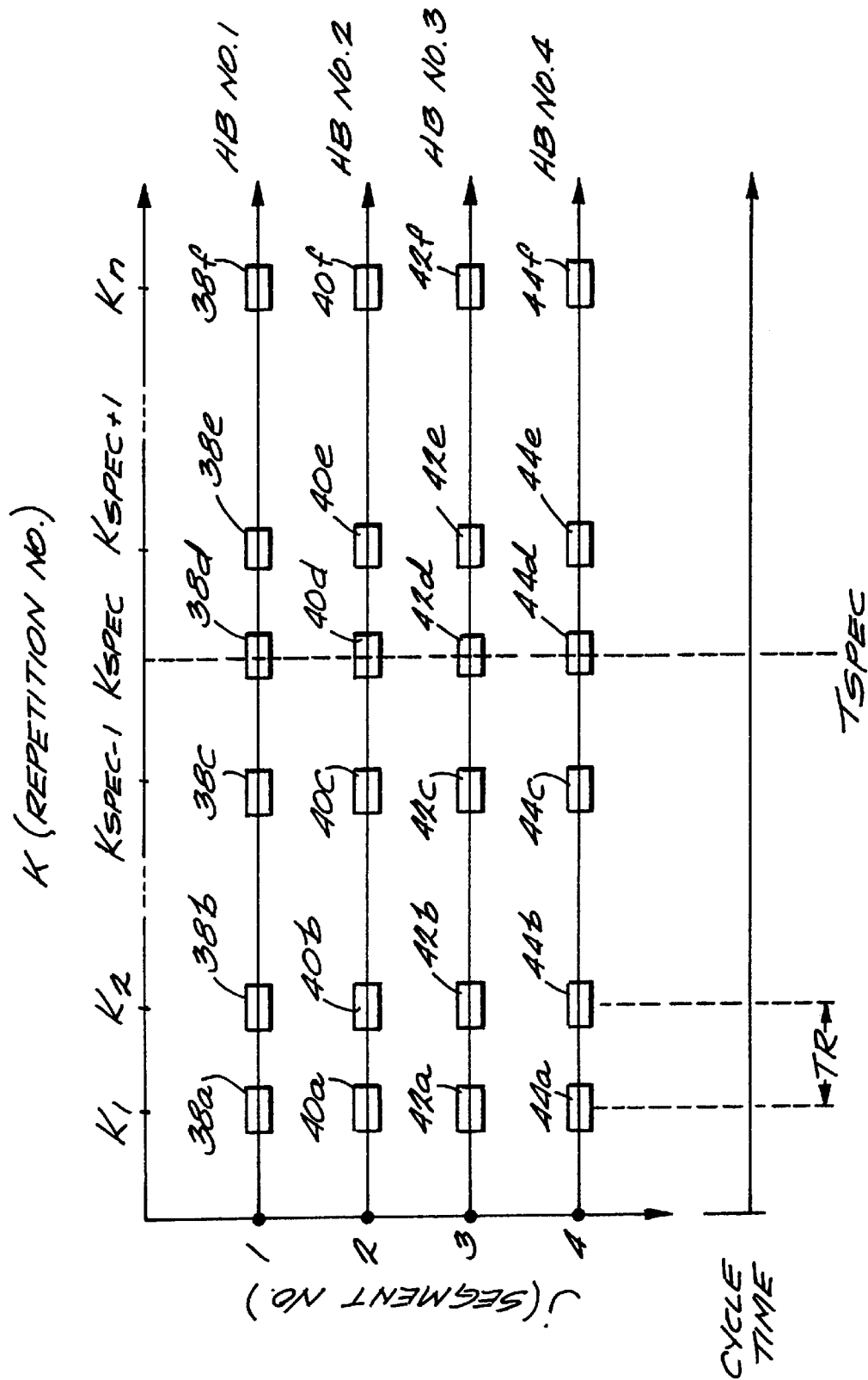
FIG. 2 is a graphic diagram showing an arrangement of segments and repetitions, to illustrate acquisition of MR data during a succession of motion cycles.

For reasons set forth hereinafter in further detail, a portion of the total views required for 3D image reconstruction are acquired during each of a succession of cardiac cycles. The views acquired during a particular cycle respectively lie along, and collectively define, a corresponding segment in the 2D k-space which includes the $k_y$ and $k_z$ axes. In accordance therewith, FIG. 2 shows j consecutively numbered segments, each corresponding to a cardiac cycle or heartbeat (HB). FIG. 2 further shows a number of repetitively occurring MR sequences, or repetitions ($k_1$–$k_n$), associated with each segment. Repetitions successively occur at an interval TR during a cardiac cycle, as indicated by the time scale shown in FIG. 2. Thus, the kth repetition of the jth segment is identified with a specific point in time, during the cardiac cycle corresponding to the jth segment. Usefully, the commencement of each motion cycle is detected by means of cardiac gating.

Referring further to FIG. 2, there are shown views 38a–38f, representative of the views which collectively define Segment No. 1 of cardiac cycle or Heart Beat No. 1. Each of such views is acquired during one of the repetitions of such cycle. Thus, the first view 38a is acquired during repetition $k_1$, and the final view 38f is acquired during the final repetition $k_n$. Similarly, views 40a–f, 42a–f and 44a–f are acquired during or in coincident relationship with repetitions associated with Segment Nos. 2, 3 and 4, respectively. It will be appreciated that while FIG. 2 shows four segments and corresponding cardiac cycles, for purposes of illustration, an actual data acquisition would generally require many more cycles.

FIG. 2 further shows a repetition $k_{spec}$ occurring at a time $T_{spec}$ during each successive cardiac cycle. Each repetition $k_{spec}$ is immediately preceded by a repetition $k_{spec-1}$ and is immediately followed by a repetition $k_{spec+1}$. It is to be understood that the time $T_{spec}$ may be selected to be any time mTR, following commencement of successive cardiac cycles, where m is an integer. For example, $T_{spec}$ could be selected to be the midpoint of successive cardiac cycles. It is to be emphasized that, in accordance with the invention, the order in which views are acquired during each cardiac cycle can readily be selected so that the prespecified views 38d–44d are acquired during repetition $k_{spec}$, for Segment Nos. 1–4, respectively. In like manner, views 38c–44c are acquired during the repetition $k_{spec-1}$ of respective cycles, and views 38e–44e are acquired during the repetition $k_{spec+1}$ thereof.

Figure 3:
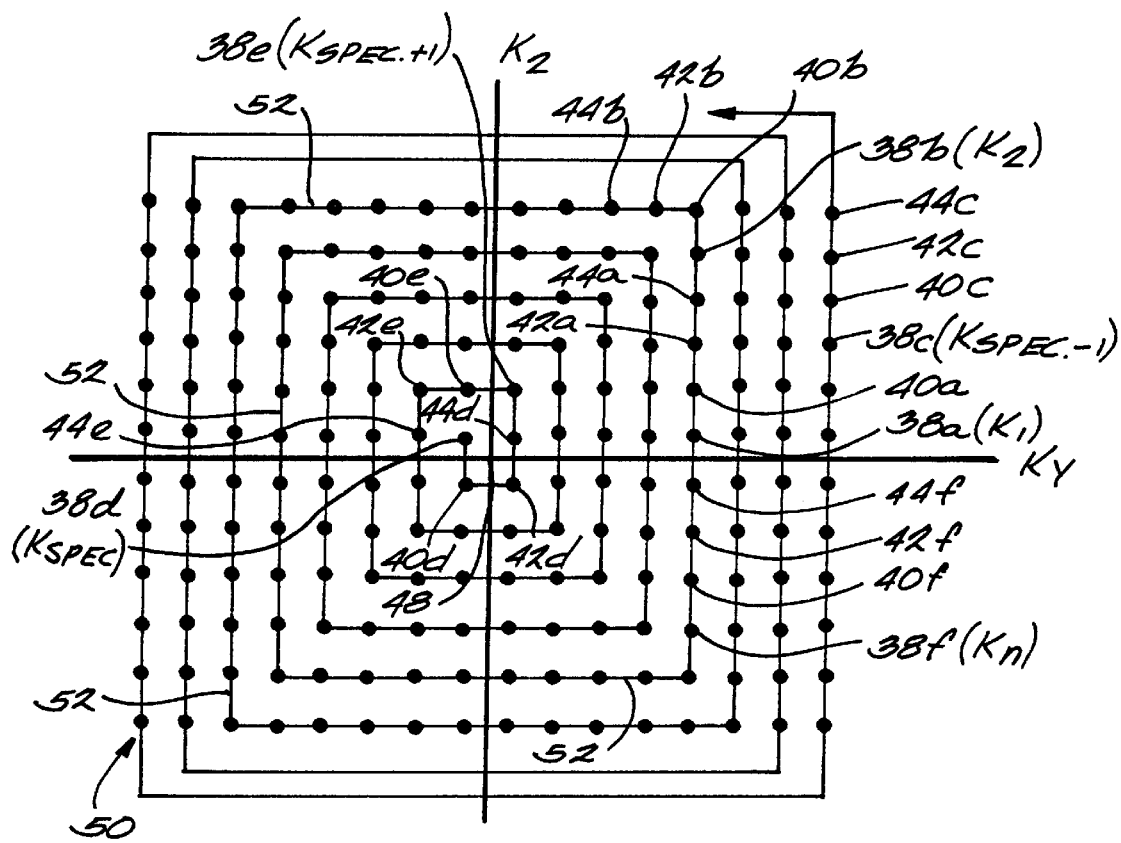
FIG. 3 is a graphic diagram depicting an arrangement of interleaved segments in two-dimensional k-space, in accordance with an embodiment of the invention.

Referring to FIG. 3, there is shown a 2D k-space 46 defined by the $k_y$ and $k_z$ axes, which intersect at a center or origin 48. There are further shown the views 38a–38f, acquired during the first cardiac cycle, having unique positions in k-space 46, as determined by their respective $k_y$ and $k_z$ coordinates. As stated above, views 38a–f lie along Segment No. 1 in the k-space, and views 40a–f, 42a–f and 44a–f lie along Segment Nos. 2–4, respectively. Respective views of all the segments collectively form a spiral or elliptical pattern, proceeding outward from k-space center 48. To illustrate such pattern. all of the acquired views are connected by lines 52, to form a spiral 50. It is seen that the views of respective segments are interleaved, that is, every fourth point along the spiral 50 is associated with a different one of the segment Nos. 1–4. While lines could be drawn to uniquely connect the views of different segments, this has not been done in FIG. 3, to avoid confusion with the spiral pattern 50 formed by the views of all the segments, collectively. It is to be understood that, in accordance with the invention, both the number of segments and the number of views per segment are arbitrary. In particular, there need not be a symmetrical arrangement of segments, as is required in certain prior art segmented imaging methods.

By placing all the views of respective segments along spiral 50 in an interleaved arrangement, the respective radial distances of the views are all different from one another. For a view at a position ($k_y$, $k_z$) in k-space, its radial distance $r_d$, i.e., the distance of the view from center 48, is given by $\sqrt{k_y^2+k_z^2}$. Moreover, views of respective segments are positioned along the spiral 50 in order of successively increasing radial distance. Accordingly, the views of lower spatial frequencies are close to k-space center 48, and the views of higher spatial frequencies are farthest therefrom.

In accordance with the invention, it has been recognized that the order in which respective views of a segment are acquired, during the corresponding cardiac cycle, is not fixed. To the contrary, the order of acquisition can be preselected, to achieve a desired result. Referring further to FIG. 3, there is shown view 38d to be the view of Segment No. 1 which is closest to k-space center 48. In like manner, views 40d–44d are shown to be the views of Segment Nos. 2–4, respectively, which are closest to the k-space center for their respective segments. This is very significant since, as stated above, the views which are closest or proximate to the k-space center, that is, which are of lowest spatial frequency, provide most of the useful information for MR image reconstruction. Moreover, as stated above in connection with FIG. 2, each of the views 38d–44d is acquired during repetition $k_{spec}$. As a result, an MR image constructed from the MR data of FIG. 3 represents or depicts structure within region 36 at the time $T_{spec}$ of the cardiac cycle. As stated above, $T_{spec}$ can be any time mTR during the cardiac cycle. Accordingly, by judicious ordering of data acquisition during respective segments and sequence repetitions, the lowest order spatial frequencies can likewise be acquired at any time mTR during the cardiac cycle. Substantial flexibility is thereby provided, in enabling structure subject to cyclical motion to be imaged at any point in its cycle.

To achieve such acquisitions, FIG. 3 further shows the views of Segment No. 1 respectively ordered so that the view 38a thereof, acquired during the very first repetition $k_1$, is located at a predetermined distance from k-space center 48, such as at the mid-point of the spiral pattern 50. Views 40a–44a, views 38b–44b, and other subsequently acquired views are positioned along spiral 50, at successively increasing radial distances from view 38a, out to views 38c–44c. The views 38c–44c, each acquired during a repetition $k_{spec-1}$, are the outward-most views of spiral 50. Thus, for the next-following repetition $k_{spec}$, view acquisitions wrap around to the k-space center 48, to view 38d. Thereafter, views are acquired in order of successively increasing radial distance, along spiral 50, up to views 38f–44f, each acquired during $k_n$, the final repetition for respective segments. Such views immediately precede view 38a, acquired during repetition $k_1$ for Segment No. 1, in view order based on increasing radial distance.

As stated above, Segment Nos. 1–4 are positioned in an interleaved arrangement, with respect to one another. By acquiring views in such segmented arrangement, one view is available from each segment which is located proximate to the k-space center, and is acquired at the time $T_{spec}$ during its corresponding motion cycle.

Figure 4:
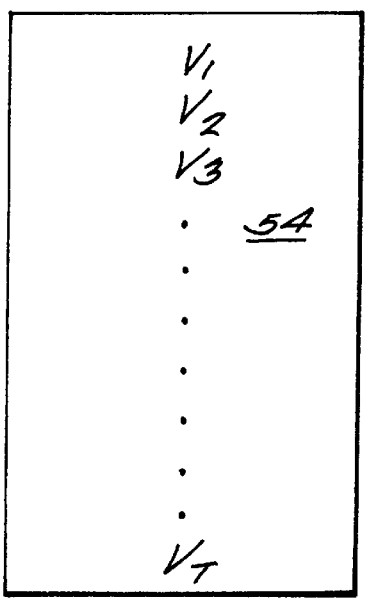
FIG. 4 shows arrangement of MR data in a look-up table.

Referring to FIG. 4, there is shown a look-up table 54, which may be employed to order respective views for acquisition in accordance with the interleaved arrangement shown in FIG. 3. The views $V_1$–$V_T$ comprising all the views to be acquired for imaging, are stored in table 54 in increasing order of radial k-space distance $r_d$. $V_T$, the total number of such views, would be the product of the total number of slices and the total number of phase encoding steps. To map a segment number and repetition number to a particular view ($k_y$, $k_z$), an index $i_r$ is applied to the view, where:

$$i_r=N_{seg}\times(k+r_s)\%VPS+j \qquad \text{Eqn. (1)}$$

In Eqn. (1), $N_{seg}$ is the total number of interleaved segments, j is the number of the segment to which the particular view is assigned, and k is the repetition during which the view is acquired. VPS is the number of views per segment, and $r_s$ indicates the location of the center of k-space along a segment. Thus, $r_s$ is related to time $T_{spec}$. $r_s$ determines the proper location along a segment of the view acquired during the first repetition $k_1$, so that successive acquisitions will wrap around to the k-space center, at the time $T_{spec}$. For example, if $r_s$=VPS/2, the center of k-space will be placed in the middle of a segment. The wrap around function is achieved by placing a modulo operation in Eqn. (1), represented by the "%" symbol.

If index $i_r$ is applied to respective views of table 50, view $V_1$ will be selected as the lowest spatial frequency of Segment 1, $V_2$ will be selected as the lowest spatial frequency of Segment 2, and so forth.

The embodiment described above in connection with FIG. 3 may be satisfactory for an image that can be constructed principally from views acquired precisely at the time $T_{spec}$ during successive motion cycles. However, it will generally be more desirable to construct an image from a number of low-order k-space views acquired during each motion cycle, where all the low-order views are clustered about $T_{spec}$, with regard to their acquisition times. This cannot be done with the arrangement of FIG. 3. As stated above, view 38d, acquired exactly at the time $T_{spec}$, and view 38e, the next view acquired thereafter, are both low-order views. However, view 38c is a high-order view, even though it is acquired at a time just preceding $T_{spec}$.

Figure 5:
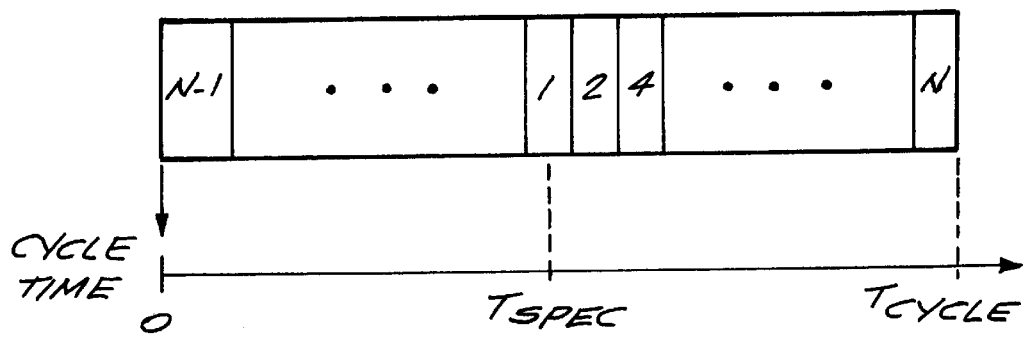
FIGS. 5–7 are graphic diagrams showing the ordering of views during a motion cycle for several modified embodiments of the invention.

Referring to FIG. 5, there is shown an ordering of views for an alternative embodiment of the invention, which eliminates discontinuities of the type described above. FIG. 5 shows a number of views N, acquired during a motion cycle, where N is usefully an even number. The time $T_{spec}$ is selected to be the mid-point of respective motion cycles, for purposes of illustration. FIG. 5 further shows a number of views, each acquired at a time mTR, wherein respective views are numbered in ascending order, to indicate their locations in k-space with respect to the k-space center. Thus, view 1 is the lowest order k-space view, that is, the view closest to the k-space center, view 2 is the next-lowest view, and view N is the highest-order view. In the arrangement shown in FIG. 5, view 1 is acquired at $T_{spec}$, and view 2 is the view immediately acquired thereafter. However, low-order view 3 is acquired immediately prior to $T_{spec}$. Thus, the views clustered around $T_{spec}$, including views acquired just before and just after $T_{spec}$, are the views of lowest order k-space for a given segment.

As a useful, but by no means necessary pattern to account for the remaining views, FIG. 5 further shows even numbered views acquired in ascending order, from $T_{spec}$ to $T_{cycle}$, when the motion cycle ends. Odd numbered views are acquired in descending order, from view N−1 at the beginning of the cycle, to view 1 at the time $T_{spec}$.

Figure 6:
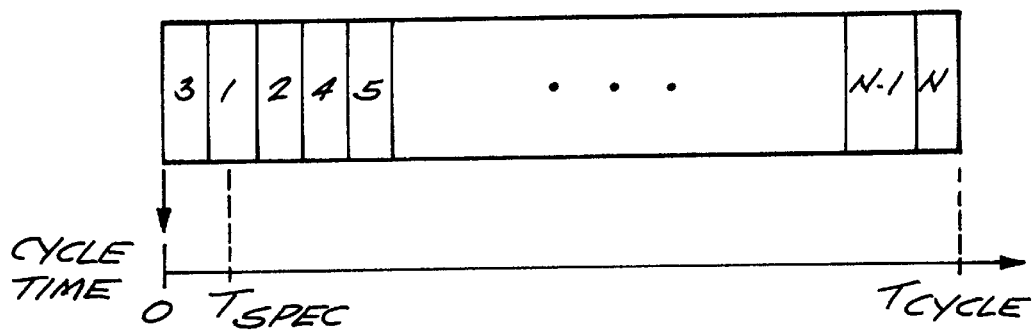
Figure 7:
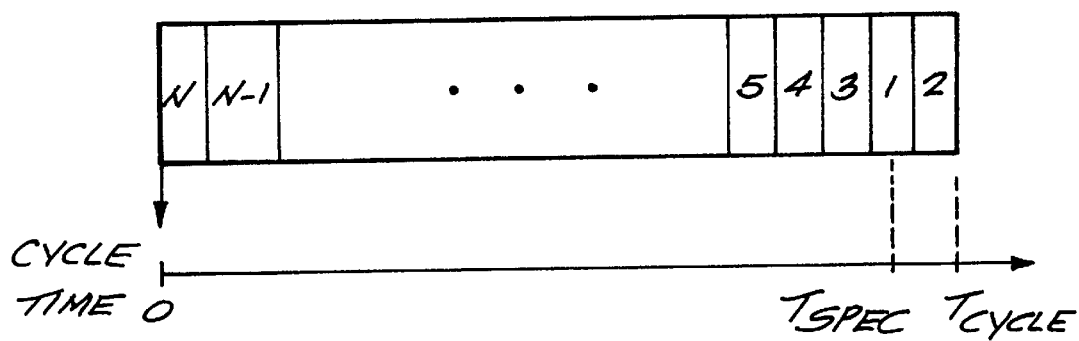

Referring to FIGS. 6 and 7, there are shown two further embodiments of the invention. FIG. 6 shows an ordering of views where $T_{spec}$ is a time very close to the beginning of the cycle, and FIG. 7 shows an ordering of views where $T_{spec}$ is a time very close to the end of the cycle. In each case, the acquisition times of low-order k-space views are clustered close to $T_{spec}$, and the remaining views are acquired in a logical sequence.

Other embodiments and variations of the present invention are possible in light of the above teachings. It is therefore to be understood that within the scope of the disclosed concept, the invention may be practiced otherwise than as specifically described.

What is claimed is:

1. A method for three-dimensional MR imaging of a region within a subject, wherein said region is disposed to experience cyclical motion, said method comprising the steps of:

detecting commencement of each of a succession of said motion cycles;

acquiring a set of MR views of said region during each motion cycle of said succession, wherein each of said views is at a known radial distance from the center of a two-dimensional k-space, and wherein each of said sets includes a lowest frequency view located proximate to said k-space center[; ]and a higher frequency view, the higher frequency view of a set being located farther from said k-space center than the lowest frequency view thereof;

acquiring each of said lowest frequency views at a specified time after commencement of its corresponding motion cycle, said specified time being the same for all of said lowest frequency view acquisitions; and acquiring the highest frequency view of a set prior to acquiring the lowest frequency view thereof.

2. The method of claim 1 wherein:

the respective views of a set collectively define a segment in said k-space, each of said segments having a succession of MR sequence repetitions associated therewith which occur at selected time intervals during one of said motion cycles;

each of the views of a given set is acquired during one of the repetitions of the segment defined by respective views of said given set; and said lowest frequency view of said given set is acquired during a specified repetition, which occurs at said specified time following commencement of the motion cycle corresponding to said given set.

3. The method of claim 2 wherein:

the views of each of said sets are stored in a look-up table, respective views being stored in said table from smallest radial k-space distance to largest radial k-space distance; and said order selecting step comprises mapping a particular repetition of a segment to each of said stored views.

4. The method of claim 3 wherein:

said mapping step is implemented by applying a specified index to each of said views stored in said look-up table.

5. The method of claim 4 wherein:

said index is disposed to provide segments which are interleaved in said k-space.

6. The method of claim 5 wherein:

each of said views comprises MR data acquired along an axis orthogonal to a plane defined by said k-space.

7. The method of claim 6 wherein:

said region of said subject comprises a selected cardiac region, and said cyclical motion comprises cardiac motion.

8. The method of claim 7 wherein:

said specified time is selected to provide views for constructing an MR image of said selected cardiac region at a selected point in time during respective cardiac cycles.

9. The method of claim 8 wherein:

each of said motion cycles is commenced in response to detection of an ECG pulse.

10. The method of claim 6 wherein:

said region of said subject comprises a selected respiratory region, and said cyclical motion comprises respiratory motion.

11. The method of claim 2 wherein:

the number of said segments and the number of repetitions associated with each of said segments are arbitrarily selected numbers.

12. The method of claim 2 wherein:

the views of said given set include a cluster of views which are each of low frequency, said cluster including the view acquired during said specified repetition, and further including the views respectively acquired during the repetitions immediately preceding and immediately following said specified repetition.

13. Apparatus for providing a three-dimensional MR image of a region within a subject, wherein said region is disposed to experience cyclical motion, said apparatus comprising:

a sensor disposed to detect commencement of each of a succession of said motion cycles;

a configuration of MR components operable to acquire a set of MR views of said region during each motion cycle of said succession, the respective views of a set being acquired in a specified order and collectively defining a corresponding segment in two-dimensional k-space, each of said sets including a lowest frequency view located proximate to a k-space center, and a higher frequency view located farther from said k-space center than the lowest frequency view; and a processor controlling operation of said MR components to select the order in which the views of respective sets are acquired so that each of said lowest frequency views is acquired at a specified time following commencement of its corresponding motion cycle, said specified time being the same for all of said lowest frequency view acquisitions, and the highest frequency view of a set is acquired prior to acquiring the lowest frequency view thereof.

14. The apparatus of claim 13 wherein:

each of said segments is defined by a number of views, said number being arbitrarily selected.

15. The apparatus of claim 14 wherein:

said region of said subject comprises a selected cardiac region, and said cyclical motion comprises cardiac motion.

16. The apparatus of claim 15 wherein:

said region of said subject comprises a selected respiratory region, and said cyclical motion comprises respiratory motion.

17. The apparatus of claim 13 wherein:

each of said k-space segments has a succession of MR sequence repetitions associated therewith which occur at selected time intervals during one of said motion cycles; and said MR components operate to acquire each of the views of a given set during one of the repetitions of the segment which is defined by respective views of said given set.

18. The apparatus of claim 21 wherein:

the views of each of said sets are stored in a look-up table, respective views being stored in said table from smallest radial k-space distance to largest radial k-space distance; and said processor maps a particular repetition of a segment to each of said stored views.

19. The apparatus of claim 18 wherein:

a specified index is applied to each of said views stored in said look-up table to implement said mapping.

20. The apparatus of claim 19 wherein:

said index is disposed to provide segments which are interleaved in said k-space.

* * * * *